(12) United States Patent
Wu et al.

(10) Patent No.: US 8,169,068 B2
(45) Date of Patent: May 1, 2012

(54) IO CELL WITH MULTIPLE IO PORTS AND RELATED TECHNIQUES FOR LAYOUT AREA SAVING

(75) Inventors: Jeng-Huang Wu, Hsinchu County (TW); Hung-Yi Chang, Hsinchu County (TW); Chun Huang, Taipei County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 256 days.

(21) Appl. No.: 12/697,582

(22) Filed: Feb. 1, 2010

(65) Prior Publication Data
US 2010/0237509 A1    Sep. 23, 2010

(51) Int. Cl.
    *H01L 23/48*    (2006.01)
(52) U.S. Cl. .................. 257/690; 257/697; 257/E23.02
(58) Field of Classification Search .......... 257/678–700, 257/E23.02
    See application file for complete search history.

(56) References Cited

U.S. PATENT DOCUMENTS

| 683,362 | A1 | 12/2004 | Rosefield et al. |
|---|---|---|---|
| 685,894 | A1 | 2/2005 | Rakshani |
| 7,071,561 | B2 | 7/2006 | Chen |
| 727,148 | A1 | 9/2007 | Madhani et al. |
| 7,266,789 | B2 | 9/2007 | Chung-Maloney et al. |
| 7,829,983 | B2 * | 11/2010 | Yamada et al. ............... 257/666 |
| 7,939,856 | B2 * | 5/2011 | Jwalant et al. ............... 257/203 |
| 7,982,294 | B2 * | 7/2011 | Kaylani et al. ............... 257/678 |

* cited by examiner

*Primary Examiner* — Thanh Nguyen
(74) *Attorney, Agent, or Firm* — Winston Hsu; Scott Margo

(57) ABSTRACT

An IO cell with multiple IO ports and related techniques are provided. The IO cell has a plurality of IO ports for transmitting signal of a same IO pin, and each IO port corresponds to a predetermined region for containing an IO pad, wherein at least one of the plural predetermined regions of the plural IO ports partially overlaps with active circuit layout region of the IO cell. In a chip, if a given IO cell has a predetermined region of an IO port overlapping an IO pad location of another adjacent IO cell, then a predetermined region of another IO port is selected for implementing an IO pad of the given IO cell, such that the IO cells can be arranged more compactly for chip layout area saving.

11 Claims, 8 Drawing Sheets

IO CELL WITH MULTIPLE IO PORTS AND RELATED TECHNIQUES FOR LAYOUT AREA SAVING

FIELD OF THE INVENTION

The present invention relates to IO cell with multiple IO ports and related techniques for layout area saving, and more particularly, to IO cell and related techniques with configurations that adjacent IO cells are selected to use different IO ports for compact IO cell placement and chip layout area saving.

BACKGROUND OF THE INVENTION

Integrated circuit (IC) has become one of the most important hardware bases of modern information society. For more prevailing adoption of ICs, how to increase integrity of ICs and reduce dimensions of ICs is a main issue of modern IC design, development and manufacturing.

Please refer to FIG. 1 which depicts a prior art IC 10 (and a partial top view of it). IC 10 is formed by packaging a chip/die 12 on a package substrate 14. The chip 10 has a core circuit 16 and a plurality of IO cells 18, each IO cell 18 has a corresponding IO pad 20. Each IO pad 20 couples to a corresponding conductive structure 24 of the package substrate 14 (e.g., lead or lead frame on the package substrate) through a corresponding bonding wire 24. Signal inputted into IC 10 is received by a corresponding IO cell 18 through its associated conductive structure 24, bonding wire 22 and IO pad 20, so the signal can be further transmitted to the core circuit 16 by the IO cell 18, and then the IC 10 can accordingly perform it functions (such as logic operations, data processing/transmission/storage and/or transaction, analog/digital signal processing, etc). On the other hand, signal outputted from the core circuit 16 is transmitted to a corresponding IO cell 18, so this IO cell 18 can drive the signal to propagate through associated IO pad 20, bonding wire 22 and conductive structure 24.

As the top view in FIG. 1 shows, the IO cells 18 are arranged surround the core circuit 16. In this prior art, each IO pad 20 has to extend outside its corresponding IO cell 18. Although chip 12 is formed with layered semiconductor structures, IO pad 20 will not overlap active circuit layout (semiconductor structures such as doped region(s)/well(s) and/or polycide) of its corresponding IO cell 18 to avoid damaging of the relatively fragile active circuit layout, since the IO pad 20 has to take mechanic stress of bonding when the chip 12 is assembled to the package substrate 14. However, because the IO pad 20 cannot be implemented overlapping its associated IO cell 18, IO pads 20 will occupy extra layout area outside IO cells 18, even dominate dimensions of the chip 12, so the chip layout area cannot be reduced.

SUMMARY OF THE INVENTION

Therefore, the invention provides an IO cell with multiple IO ports and related techniques for effective chip layout area saving. The IO cell of the invention includes a plurality of ports with each port respectively corresponding to an IO pad. With such design, neighboring/adjacent IO cells can select different IO ports for implementing respective IO pads, so an IO pad of an IO cell can partially overlap an adjacent IO cell for compact IO cell arrangement and chip layout area saving.

To be more specific, an object of the invention is to provide an IO cell for implementing a chip, the IO cell includes a main region for containing circuit layout of the IO cell, and a plurality of IO ports located in the main region. The plurality of IO ports transmit signal of a same IO pin, each of the IO port respectively provides a corresponding predetermined region for selectively containing an IO pad, and at least a predetermined region partially overlaps the main region. With the plurality of IO ports, each IO cell can provide a plurality of different configurations; in each configuration, at least a predetermined region corresponding to an IO port has an IO pad occupied, and at least a predetermined region corresponding to another IO port is left empty without IO pad.

In an embodiment of the IO cell, where the main region overlaps with at least a predetermined region has active circuit layout occupied.

In an embodiment of the IO cell, each of the predetermined regions partially overlaps the main region.

In an embodiment of the IO cell, each IO pad is a bonding pad with a bonding opening.

In an embodiment of the IO cell, location of each IO port partially overlaps its corresponding predetermined region.

In an embodiment of the IO cell, the main region of each IO cell includes a core device region and an IO device region, and wherever the predetermined region overlaps the main region is in the IO device region.

In an embodiment of the IO cell, the main region includes a core device region and an IO device region, and at least a predetermined region of the plural predetermined regions partially overlaps the core device region.

In an embodiment of the IO cell, the IO pad contained by each predetermined region includes a conductive layer, and the IO ports of the IO cell are separate on the conductive layer.

Another object of the invention is to provide a method for implementing (including design and/or manufacturing) a chip, the method includes: providing an IO cell with multiple IO ports comprising a main region for containing circuit layout of the IO cell with multiple IO cells, and a plurality of IO ports located in the main region; the plurality of IO ports transmitting signal of a same IO pin, each of the IO port respectively providing a corresponding predetermined region for containing an IO pad, and at least a predetermined region of the plurality of predetermined regions corresponding to the plurality of IO ports partially overlapping the main region. Also the method includes: placing at least an IO cell with multiple IO ports in a region of the chip; and selecting an IO port from the plurality of IO ports of a placed IO cell with multiple IO ports and implementing an IO pad in the predetermined region corresponding to the selected IO port.

In an embodiment of the method, wherein selecting the IO port for the placed IO cell with multiple IO ports includes: selecting the IO port according to a bonding rule of assembly house.

In an embodiment of the method, wherein selecting the IO port for a given IO cell with multiple IO ports further includes: if the predetermined region corresponding to the selected IO port overlaps an IO pad location of a neighboring/adjacent IO cell, selecting another IO port from the plurality of IO ports of the given IO cell.

In an embodiment of the method, it further includes: providing another kind of single port IO cell which has a single IO port for a single IO pad.

In an embodiment of the method, it further includes: after selecting the IO port of the placed IO cell, implementing a supporting layer for implementing an IO pad in the predetermined region corresponding to the selected IO port.

Following the aforementioned method, wherein when providing the IO cell with multiple IO ports, providing the IO cell with multiple IO ports with the supporting layer empty.

In an embodiment of the method, wherein providing the IO cell with multiple IO ports includes: providing the IO cell with multiple IO ports having active circuit layout occupying where the main region partially overlaps with at least a predetermined region.

Another object of the invention is to provide a chip including a core circuit and at least an IO cell with multiple IO ports for transmitting signal of the core circuit. Each of the IO cell with multiple IO ports includes a main region for containing circuit layout of the IO cell with multiple IO ports, and a plurality of IO ports located in the main region. The plurality of IO ports transmit signal of a same IO pin, each of the IO port respectively provides a corresponding predetermined region as a candidate location for selectively containing an IO pad, and at least one of the plurality of predetermined regions corresponding to the plurality of IO ports partially overlaps the main region. With the IO ports, each IO cell with multiple IO ports can provide a plurality of different configurations; in each configuration, at least a predetermined region corresponding to an IO port has an IO pad occupied, and at least a predetermined region corresponding to another IO port is left empty without IO pad.

In an embodiment of the chip, at least an IO cell with multiple IO ports has a predetermined region partially overlapping a location of an IO pad of a neighboring/adjacent IO cell.

In an embodiment of the chip, it further includes at least one of another kind of single port IO cell for a single IO pad.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
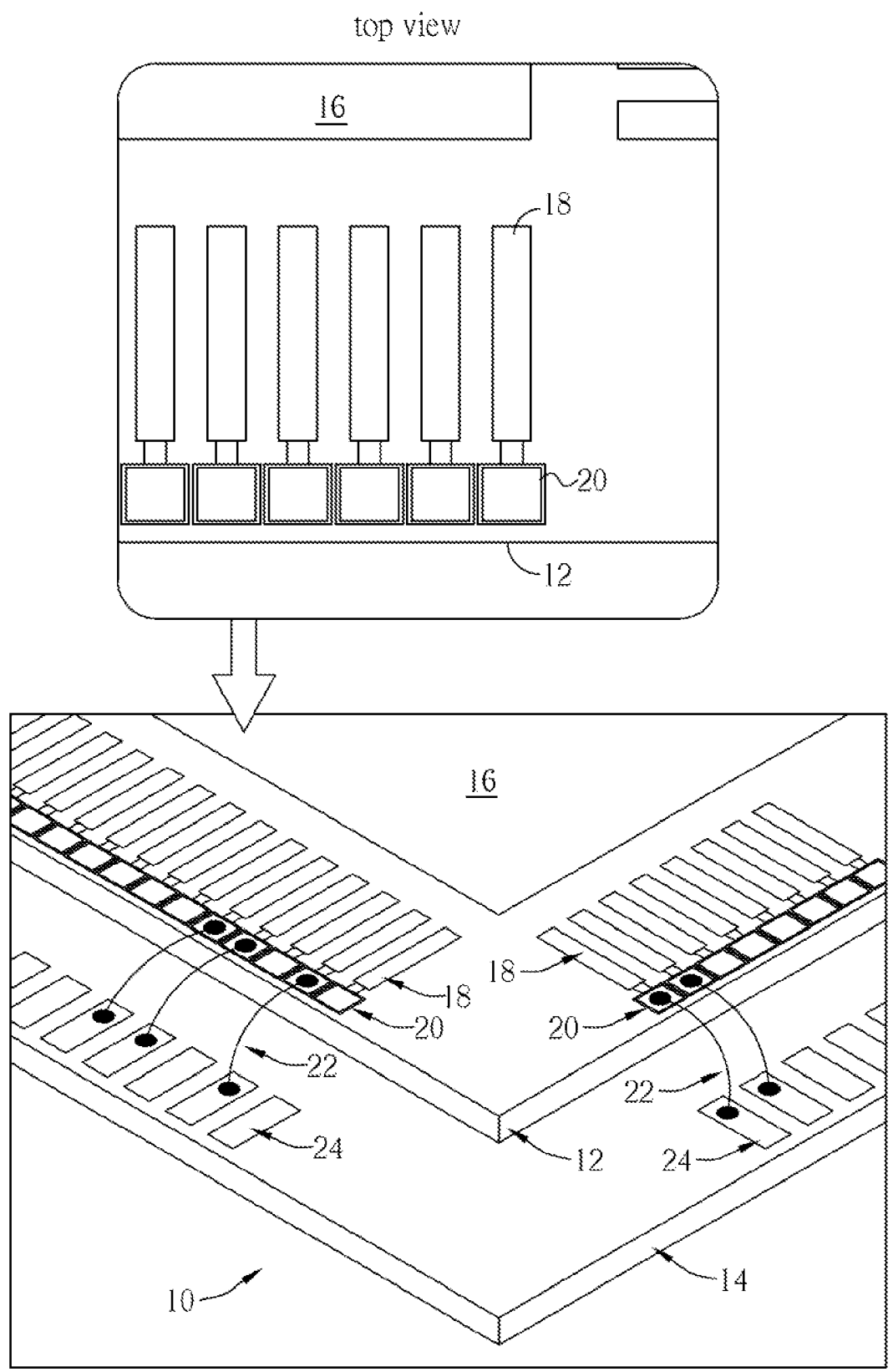
FIG. 1 illustrates a prior art IC.
Figure 2:
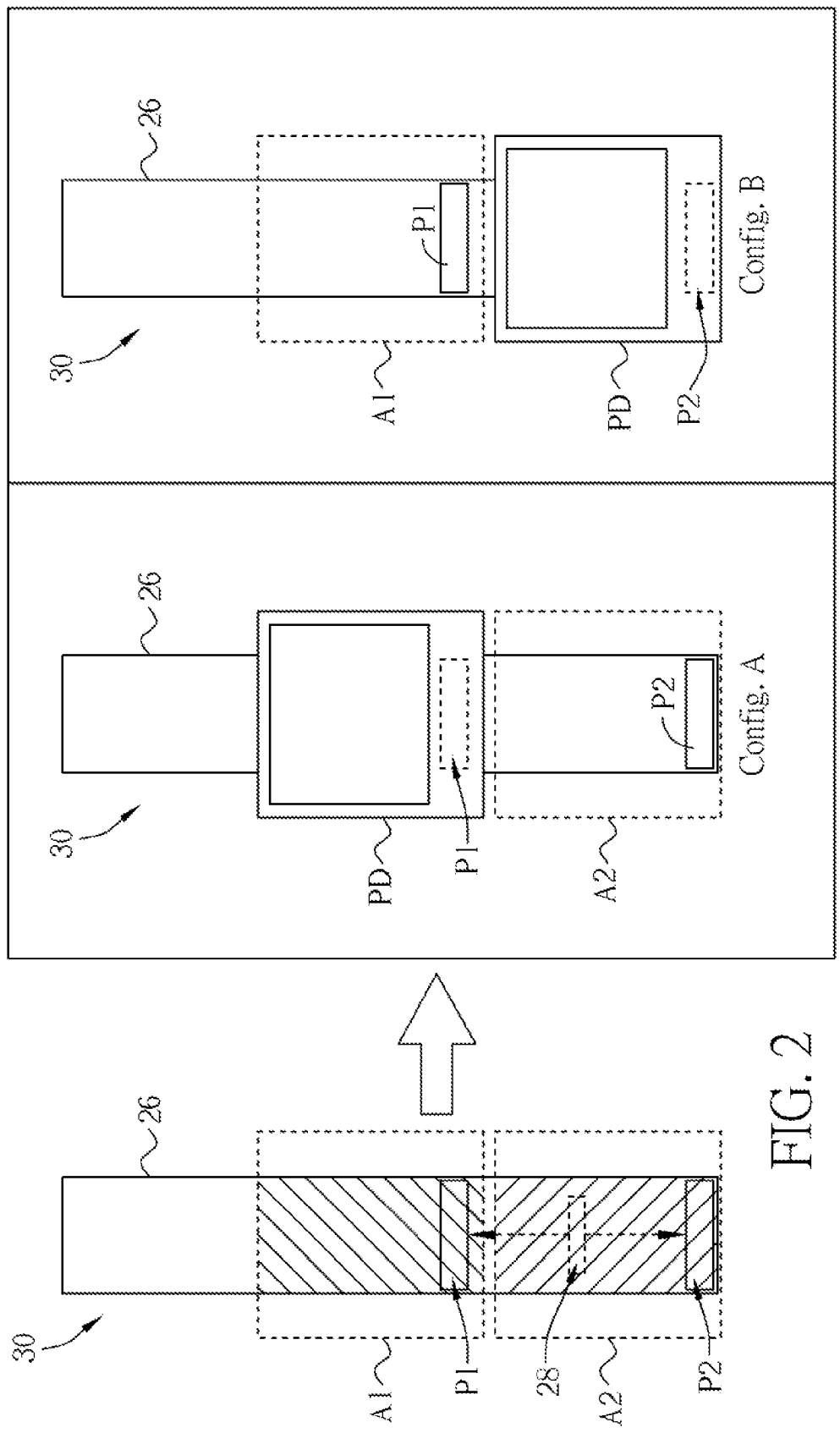
FIG. 2 illustrates an IO cell according to an embodiment of the invention.

Please refer to FIG. 2 which illustrates an IO cell 30 according to an embodiment of the invention. Circuit layout of the IO cell 30 is contained in a main region 26, and the IO cell 30 has a plurality of IO ports; in the embodiment of FIG. 2, two IO ports P1 and P2 are shown as an example of the invention. IO ports P1 and P2 locate in the main region 26 and correspond to a same IO pin 28, such that both these two IO ports P1 and P2 can transmit signal of the IO pin 28. The IO ports P1 and P2 respectively correspond to predetermined regions A1 and A2, each of the predetermined regions A1 and A2 can be selectively used to contain an IO pad; and, at least one of the predetermined regions A1 and A2 partially overlaps the main region 26. In the embodiment of FIG. 2, both predetermined regions A1 and A2 partially overlap with the main region 26, as the overlapped regions are filled with slash hatch in FIG. 2. In other words, it can be understood from the predetermined regions A1 and A2 that the IO pad can be implemented by overlapping above the main region 26 for saving chip layout area.

Figure 3:
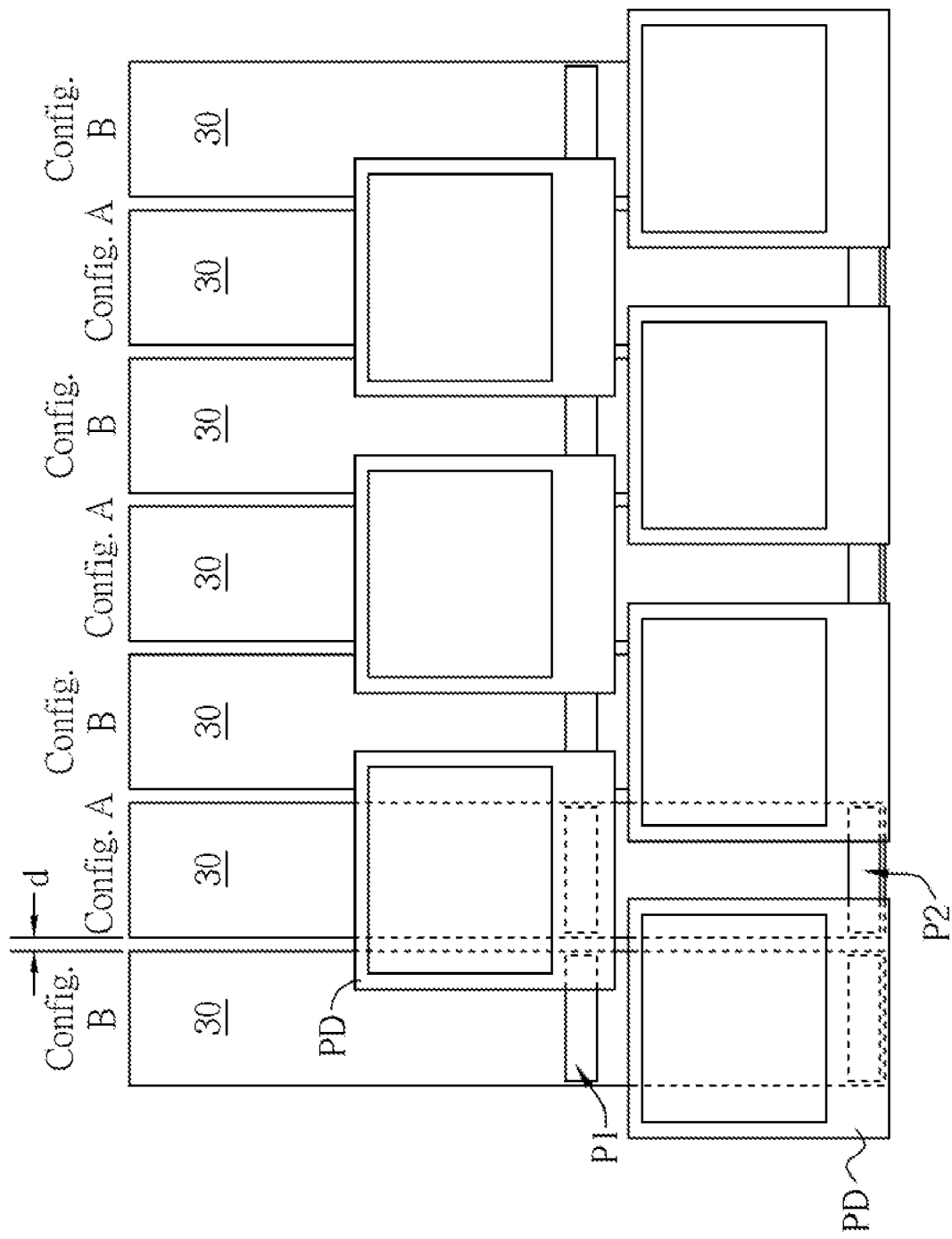
FIG. 3 demonstrates the IO cells of FIG. 2 arranged in adjacent to each other.

On the other hand, it can also be understood that the IO cell 30 of the invention is an IO cell with multiple IO ports. Therefore, one of the IO ports of an IO cell can be flexibly selected for locating the IO pad of the IO cell. As the configuration A (Config. A) shown in FIG. 2, an IO pad PD occupies the predetermined region A1 corresponding to the IO port P1, then the IO pin 28 can transmit signal through the IO port P1 and the IO pad PD; the other IO port P2 (and its corresponding predetermined region A2) are left unoccupied. On the contrary, in configuration B (Config. B) of FIG. 2, the predetermined region A2 corresponding to the IO port P2 is selected for containing the IO pad PD, so the IO pin 28 can transmit signal through the IO port P2 and the IO pad PD, and the IO port P1 is left empty without any IO pad. Because both the configurations A and B can be used for transmitting (either sending, receiving or both) signal of the IO pin 28 through the IO pad PD, layout area saving is achieved by adopting these different configurations while aligning the IO cells Please refer to FIG. 3, which illustrates how the IO cells 30 can be arranged in adjacent for chip layout area saving. As shown in FIG. 3, adjacent IO cells 30 use different configurations for locating their respective IO pads PD, such that an IO pad PD of an IO cell can partially overlap an adjacent IO cell. For example, the leftmost IO cell 30 is configured as the configuration B with its IO pad PD in the predetermined area A2 of its IO port P2, and an other IO cell 30 right adjacent to the leftmost IO cell 30 is selectively configured as the configuration A with its IO pad PD in the predetermined area A1 of its IO port P1. That is, by selecting different configurations for adjacent IO cells 30, IO pad PD of an IO cell 30 can partially overlap an adjacent IO cell 30 without affecting IO pad structure of the adjacent IO cell 30. In this way, distance d (as labeled in FIG. 3) between IO cells 30 can be reduced for more compact alignment of the IO cells 30 and smaller chip layout area.

Figure 4:
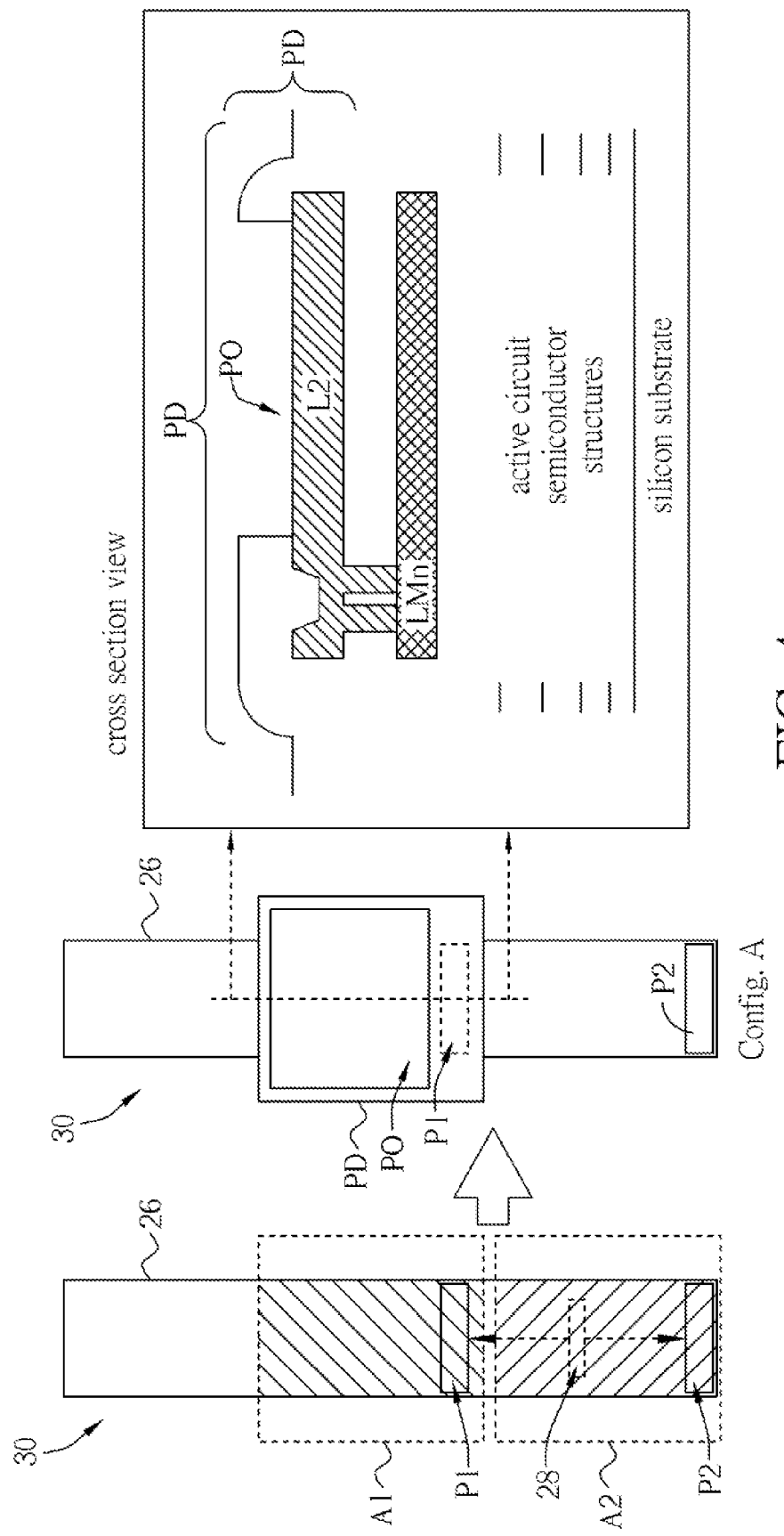
FIG. 4 illustrates a semiconductor structure of the IO cell in FIG. 2.

Please refer to FIG. 4, which illustrates an example for an IO pad PD being implemented in the IO cell 30 according to an embodiment of the invention. Modern semiconductor manufacturing technology allows an IO pad overlaps above the IO cell 30. In other words, active circuit layout, including semiconductor structures such as doped region(s)/well(s) and/or polycide, can extend into regions where predetermined regions A1 and A2 overlap the main region 26, i.e., regions filled with slash hatch in FIG. 2 and FIG. 4. In FIG. 4, a cross section view of the configuration A of FIG. 2 is shown as an example to demonstrate how the IO pad PD overlaps active circuit layout of the IO cell 30. As shown in the cross section view, semiconductor structures of lower layers (such as doped region(s)/well(s), metal layer(s), polycide layer(s), oxide layer(s)) form the active circuit layout of the IO cell 30, a conductive metal layer (or layers, as one layer is exemplarily shown in FIG. 4) LMn formed above functions as a supporting layer, and another conductive metal layer L2 on top forms the pad PD with its surrounding oxide layer defining a bonding opening PO. Due to existence of the supporting layer, the IO pad PD can be used as a bonding pad for mechanic stress of bonding.

In the embodiment of FIG. 4 (and FIG. 2), the predetermined regions A1 and A2 respectively overlap locations of the IO port P1 and P2, so the IO pad PD can direct couple to the IO ports P1 and P2 formed in lower layers of semiconductor structures, and IO port P1 or P2 does not need additional routings formed on the metal layer(s) L2 and/or LMn for coupling to the IO pad PD. Such design simplifies routings of metal layer(s) L2 and/or LMn, eliminates interferences between IO pad location of an IO cell and routings on the same layer(s) (i.e., routings on metal layers L2 and/or LMn) of an adjacent IO cell, and helps to achieve compact IO cell arrangement and smaller chip layout area. That is, the IO ports P1 and P2 are mutually separate (disconnected) on the metal layers L2 and/or LMn (IO ports P1 and P2 can be coupled to corresponding IO pin 28 with semiconductor structures under the metal layers L2 and LMn). In fact, in an embodiment of the invention, the IO ports P1 and P2 (and the IO cell 30 itself) do not have pre-defined layouts on metal layers L2 and LMn to left these metal layers empty; necessary layout on the metal layers L2 and LMn can be decided after arrangement and placement of the IO pad.

Figure 5:
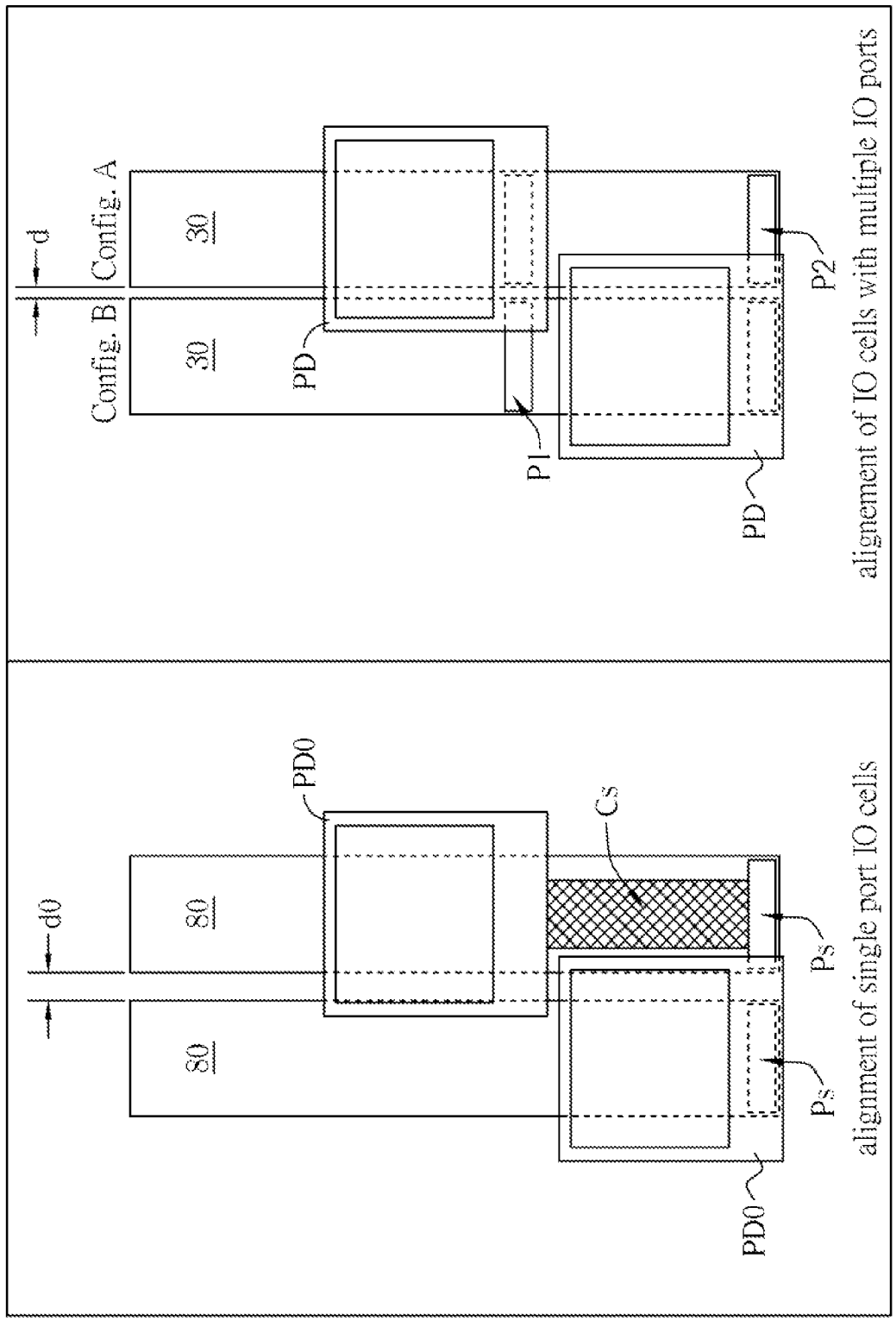
FIG. 5 compares arrangements of the IO cells of FIGS. 2 and IO cells of a single IO port.

The above discussion can be further illustrated with FIG. 5. The left side of FIG. 5 shows alignment of single port IO cells 80; since each IO cell with a single port 80 only has a single port Ps, if alternating configurations are desired for each IO pad PD0 of each adjacent IO cell 80, some IO cells 80 will respectively need an additional routing Cs for connect IO port Ps to IO pad PD0. As the width of the routing Cs will interfere location of adjacent IO pad, the distance d0 between adjacent IO cells 80 can not be effectively reduced. On the contrary, because the IO cell 30 of the invention has multiple IO ports, routings between IO ports and the IO pad can be effectively simplified to reduce the distance d between the IO cells 30, as shown in the right side of FIG. 5.

Figure 6:
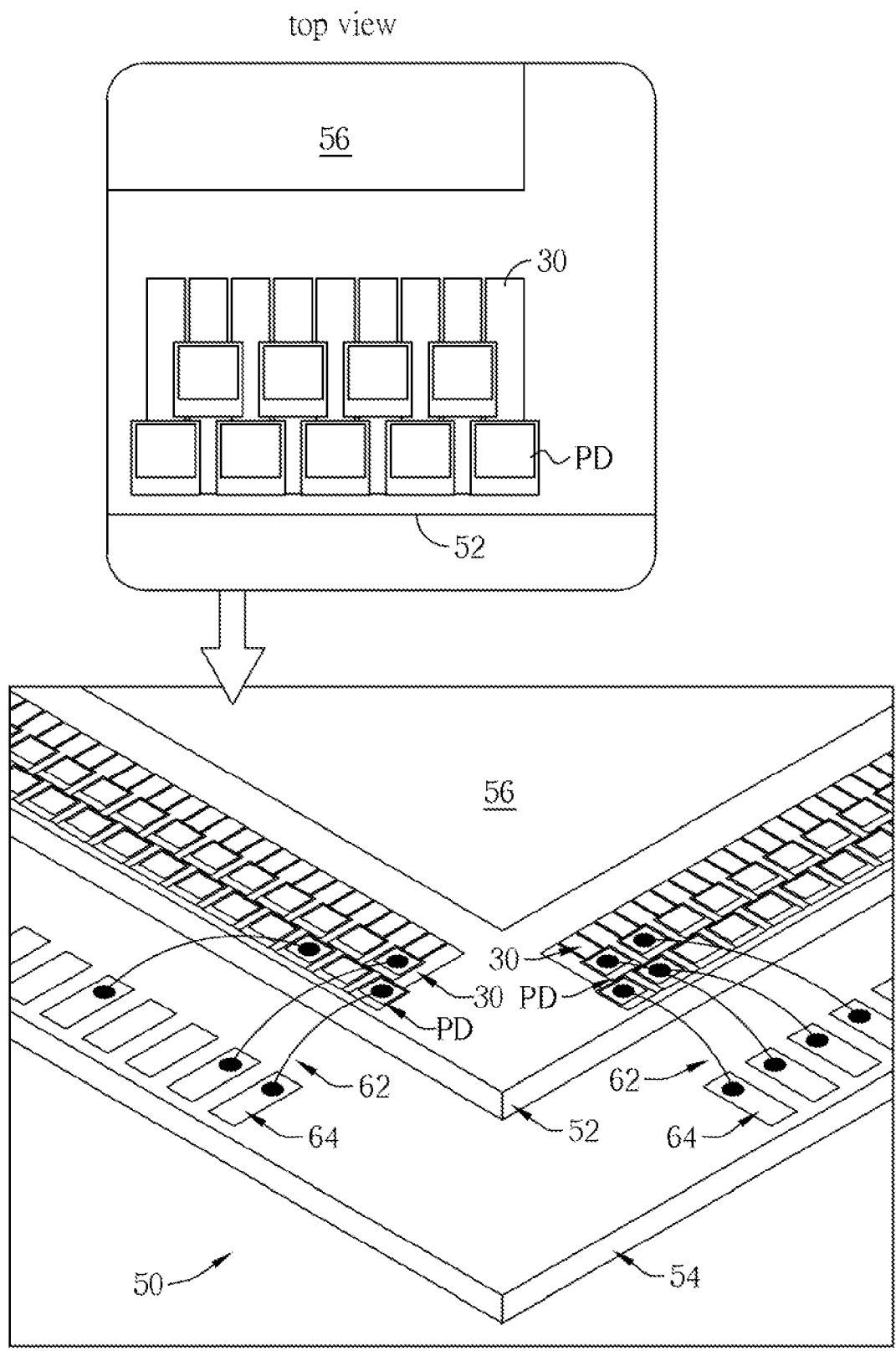
FIG. 6 depicts the IO cells of FIG. 2 applied in a chip/IC.

Please refer to FIG. 6 which depicts the IO cells 30 of the invention applied to an IC 50 (and a partial top view) according to an embodiment of the invention. IC 50 is formed by packaging a chip/die 52 on a package substrate 54; also the package substrate 54 can be another circuit, such as another chip in an SIP (System In Package). The chip 52 has a core circuit 56 and a plurality of IO cells 30, each IO cell 30 has a corresponding IO pad PD. Each IO pad PD couples to a corresponding conductive structure 64 (like lead/lead frame of package substrate, or IO pad(s) of another chip) of the package substrate 54 through associated bonding wire 62. Signal transmitted to the IC 50 is transmitted to a corresponding IO cell 30 through associated conductive structure 64, bonding wire 62 and IO pad PD, so the IO cell 30 can transmit the signal to the core circuit 56, and then the core circuit 56 can accordingly performs it functions (such as logic operations, data processing/transmission/storage and/or transactions, analog/digital signal processing, etc). Signal outputted from the core circuit 56 is transmitted to a corresponding IO cell 30, so this IO cell 30 can drive the signal to be outputted from the IC 50 along associated IO pad PD, bonding wire 62 and conductive structure 64.

As shown in top view of FIG. 6, the IO cells 30 of the invention are arranged around the core circuit 56 in the way disclosed in FIG. 3, so as to save total layout area of the chip 52. While placed in a chip, the IO cells 30 of the invention can be arranged with each other as shown in FIG. 3, the IO cells can also be aligned with single port IO cells. Each single port IO cell has a single IO port for a single IO pad. While aligning single port IO cells with IO cells with multiple IO ports of the invention, an IO port of an IO cell with multiple IO ports having a predetermined region not overlapping IO pad location of an adjacent single port IO cell is selected to gain compact alignment and smaller chip layout area.

Generally speaking, an IO cell has a core device and an IO device. The core device can include circuits like level shifter, and the IO device can include circuits such as buffer and/or ESD (Electro-Static Discharge) protection circuit. Because the core circuit of a chip and its peripheral IO cells can operate in different operation voltages, the core device of each IO cell acts as a signal interface between the core circuit and each IO cell, such that signals of different amplitude ranges can exchange through this signal interface. According to operations of the core device, the IO device of each IO cell can either receive, drive or transceiver signal on associated IO pad, and perform ESD protection.

Figure 7:
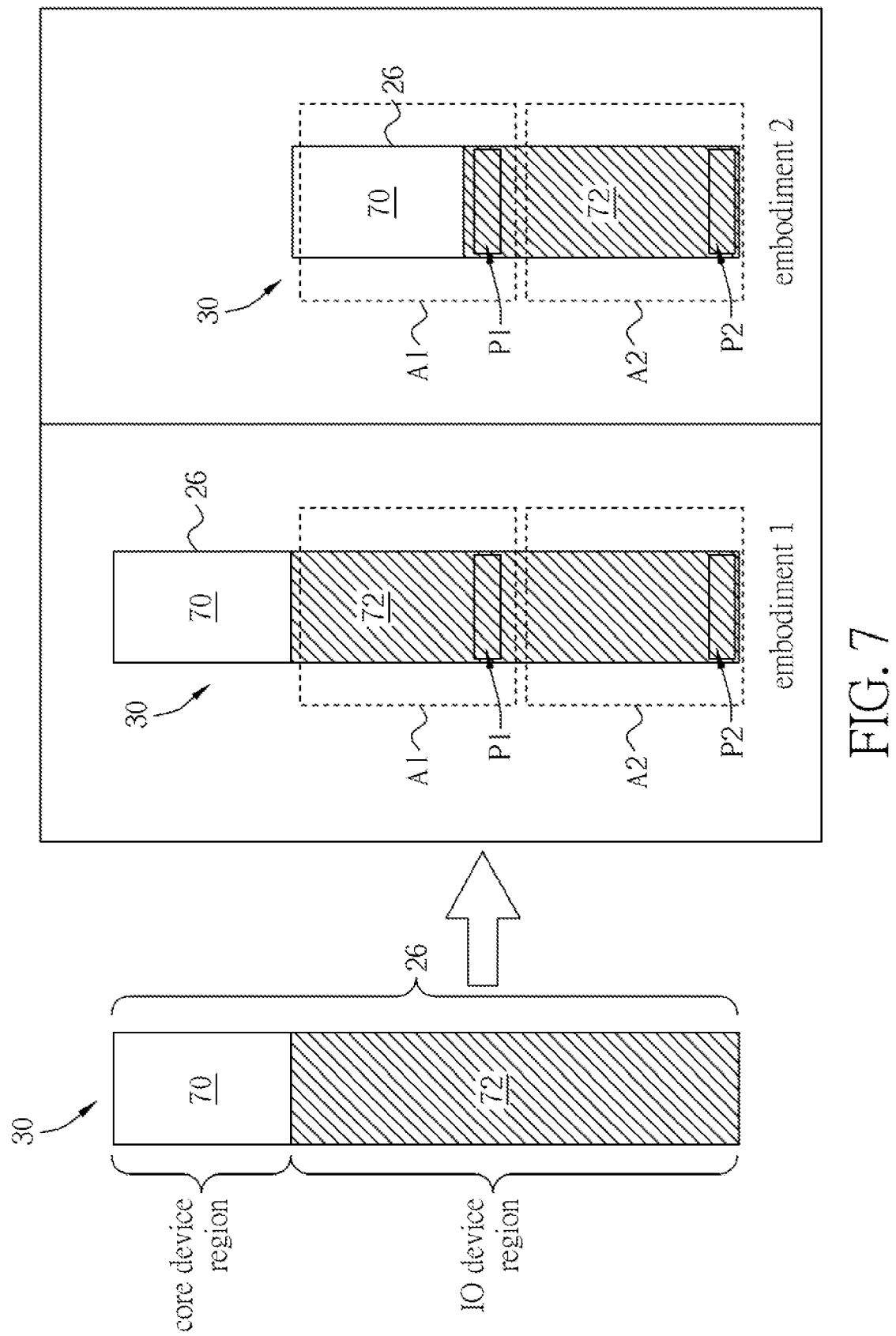
FIG. 7 shows various embodiments of the IO cell of FIG. 2.

Please refer to FIG. 7, which illustrates various embodiments with different relations between core device, IO device and predetermined regions of each IO cell 30. In the IO cell 30 of the invention, the main region also covers a core device region 70 and an IO device region 72 for containing active circuit layouts of core device and IO device, respectively. With present semiconductor manufacturing technology, an IO pad is allowed to be formed above the IO device, but it is not suggested to be formed above the core device. Therefore, in the embodiment 1 of FIG. 7, each of the predetermined regions A1 and A2 overlaps the main region 26 in the IO device region 72 of the IO cell 30; in other words, each predetermined region overlaps the main region 26 only in the IO device region 70, not in the core device region 72.

However, with advanced semiconductor manufacturing technology, IO pad can partially overlap above the core device region, i.e., at least a predetermined region for the IO pad will be allowed to partially overlaps the core device region, as shown in the embodiment 2 of FIG. 7. In this embodiment, the predetermined region A1 corresponding to the IO port P1 partially overlaps the core device region 70, which implies that an IO pad can be formed above the core device for further reducing layout area of the IO cell 30. Since the alternating arrangement shown in FIG. 3 applies to both embodiments of FIG. 7, chip layout area can be effectively reduced with either embodiment in FIG. 7. In fact, in the embodiment 2 of FIG. 7, because the main region 26 is almost covered by candidate regions of IO pad (i.e., the predetermined regions), the IO cell 30 can be considered to be hidden under IO pad for extreme chip area saving.

Figure 8:
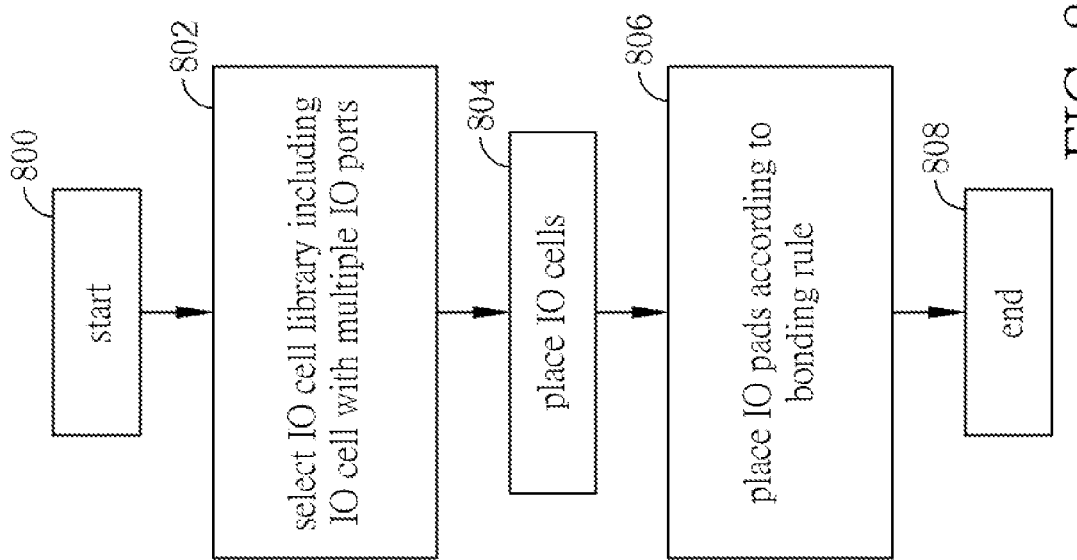
FIG. 8 illustrates a method for applying the IO cells of FIG. 2 to a chip.

The invention also provides a method for implementing (including design and/or manufacturing) a chip, especially a method for arranging IO cells in a chip. The flow of the method is illustrated in FIG. 8 with steps as follows.

Step 800: start.

Step 802: select an IO cell library which includes IO cell(s) with multiple IO ports of the invention, and select required IO cell(s) from the selected IO cell library for implementing the chip. IO cell(s) with multiple IO ports of the invention can be selected. As discussed in FIG. 4, the IO cell 30 with multiple IO ports included in the cell library can be empty on metal layers L2 and LMn without any pre-defined layouts. That is, IO pad structure does not need to be included in the IO cell provided in this step.

Step 804: place IO cells in the chip.

Step 806: select IO pad location for implementing IO pad for each IO cell according to a bonding rule of assembly house. That is, an IO port is selected from the IO ports of each placed IO cells, such that an IO pad can be implemented in corresponding predetermined region and coupled to the selected IO port of each IO cell. As discussed for FIG. 3, alternating selected configurations of adjacent IO cells can be adopted to reduce distances between IO pads for chip area saving as long as the bonding rule allows. For example, while selecting an IO port for a given IO cell with multiple IO ports, if the selected IO port corresponds to a predetermined region partially overlapping an IO pad location of an adjacent IO cell, then another IO port of the given IO cell is alternatively selected for implementing the IO pad. The adjacent IO cell can be another IO cell with multiple IO ports or a single port IO cell. Layouts on the metal layers L2 and LMn related to IO pads can be decided until this step.

Step 808: end.

To sum up, comparing to prior art IO cell and related techniques, IO cell of the invention has multiple IO ports for simplifying routing layouts of related metal layers, such that adjacent IO cells can align in alternating configurations without mutual interference, and layout area of the chip can be effectively reduced. In addition to chip/IC design and manufacturing, IO cell with multiple IO ports of the invention can also be applied to IO cell library as intellectual property resources of circuit/IC design and manufacturing.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An IO cell for a chip comprising:
   a main region for containing circuit layout of the IO cell; and
   a plurality of IO ports located in the main region; the plurality of IO ports transmitting signal of a same IO pin, each of the IO port respectively providing a corresponding predetermined region for containing an IO pad, and at least a predetermined region of the plurality of predetermined regions corresponding to the plurality of IO ports partially overlapping the main region;
   wherein the IO cell provides a plurality of different configurations with the plurality of IO ports; in each configuration, at least a predetermined region corresponding to an IO port has an IO pad occupied, and at least a predetermined region corresponding to another IO port is left empty without IO pad.

2. The IO cell of claim 1, wherein where at least a predetermined region and the main region partially overlap has active circuit layout occupied.

3. The IO cell of claim 1, wherein each of the plurality of predetermined regions partially overlaps the main region.

4. The IO cell of claim 1, wherein the IO pad is a bonding pad with a bonding opening.

5. The IO cell of claim 1, wherein a location of each IO port partially overlaps its corresponding predetermined region.

6. The IO cell of claim 1, wherein the main region comprises a core device region and an IO device region, and wherever the predetermined regions partially overlap the main region is in the IO device region.

7. The IO cell of claim 1, wherein the main region comprises a core device region and an IO device region, and at least a predetermined region of the plurality of predetermined regions partially overlaps the core device region.

8. The IO cell of claim 1, wherein the IO pad contained by each predetermined region comprises a conductive layer, and the plurality of IO ports are separate on the conductive layer.

9. A chip comprising:
   a core circuit; and
   at least an IO cell with multiple IO ports for transmitting signal of the core circuit, each of the IO cell with multiple IO ports comprising:
      a main region for containing circuit layout of the IO cell with multiple IO ports; and
      a plurality of IO ports located in the main region; the plurality of IO ports transmitting signal of a same IO pin, each of the IO port respectively providing a corresponding predetermined region for containing an IO pad, and at least a predetermined region of the plurality of predetermined regions corresponding to the plurality of IO ports partially overlapping the main region; wherein the IO cell with multiple IO ports provides a plurality of different configurations with the plurality of IO ports; in each configuration, at least a predetermined region corresponding to an IO port has an IO pad occupied, and at least a predetermined region corresponding to another IO port is left empty without IO pad.

10. The chip of claim 9, wherein at least an IO cell with multiple IO ports has a predetermined region partially overlaps a location of an IO pad of a neighboring IO cell.

11. The chip of claim 9 further comprising at least one of another kind of single port IO cell for a single IO pad.

\* \* \* \* \*

UNITED STATES PATENT AND TRADEMARK OFFICE
CERTIFICATE OF CORRECTION

PATENT NO.         : 8,169,068 B2
APPLICATION NO.    : 12/697582
DATED              : May 1, 2012
INVENTOR(S)        : Jeng-Huang Wu et al.

It is certified that error appears in the above-identified patent and that said Letters Patent is hereby corrected as shown below:

On the title page, insert item (30)
--Foreign Application Priority Data
Mar. 19, 2009 (TW)....... 98108962--.

Signed and Sealed this
Twenty-sixth Day of June, 2012

David J. Kappos
*Director of the United States Patent and Trademark Office*